United States Patent
Singh et al.

(10) Patent No.: US 11,340,295 B2
(45) Date of Patent: May 24, 2022

(54) PARTITIONED FORCE-SENSE SYSTEM FOR TEST EQUIPMENT

(71) Applicant: Analog Devices, Inc., Norwood, MA (US)

(72) Inventors: Amit Kumar Singh, Woburn, MA (US); Christopher C. McQuilkin, Hollis, NH (US); Brian Carey, Stow, MA (US)

(73) Assignee: Analog Devices, Inc., Norwood, MA (US)

( * ) Notice: Subject to any disclaimer, the term of this patent is extended or adjusted under 35 U.S.C. 154(b) by 118 days.

(21) Appl. No.: 17/038,598

(22) Filed: Sep. 30, 2020

(65) Prior Publication Data
US 2022/0099739 A1 Mar. 31, 2022

(51) Int. Cl.
*G01R 31/28* (2006.01)
*G01R 31/319* (2006.01)
*G01R 31/317* (2006.01)

(52) U.S. Cl.
CPC ... *G01R 31/31905* (2013.01); *G01R 31/2891* (2013.01); *G01R 31/31702* (2013.01)

(58) Field of Classification Search
CPC .............. G01R 1/067; G01R 1/06716; G01R 1/06722; G01R 1/07314; G01R 1/07342; G01R 31/2891
See application file for complete search history.

(56) References Cited

U.S. PATENT DOCUMENTS

| | | | |
|---|---|---|---|
| 6,343,498 B1 * | 2/2002 | Oba | G01D 3/08 73/1.57 |
| 2021/0172829 A1 * | 6/2021 | Kim | G01M 7/025 |

OTHER PUBLICATIONS

"1.25 GHz Dual Integrated DCL with PPMU, Level Setting DACs, and On-Chip Calibration Registers", Analog Devices, Inc., (2015), 82 pgs.

* cited by examiner

*Primary Examiner* — Tung X Nguyen
(74) *Attorney, Agent, or Firm* — Schwegman Lundberg & Woessner, P.A.

(57) ABSTRACT

A force-sense system for providing signals to, or receiving signals from, a device under test (DUT) at a first DUT node. The system can include an interface coupling first and second portions of a first force-sense measurement device, such as a parametric measurement unit. The first and second portions of the first force-sense measurement device can be provided using respective different integrated circuits, such as can comprise different semiconductor dies of different die types. In a first test mode, the interface can be configured to communicate a first DUT force signal from the first portion to the second portion of the first force-sense measurement device, and in a second test mode the interface can be configured to communicate DUT sense information, received from the DUT at the first DUT node, from the second portion to the first portion of the first force-sense measurement device.

20 Claims, 5 Drawing Sheets

PARTITIONED FORCE-SENSE SYSTEM FOR TEST EQUIPMENT

BACKGROUND

A test system for electronic device testing can include a pin driver circuit that provides a voltage test pulse to a device under test (DUT). In response, the test system can be configured to measure a response from a DUT, such as to determine whether the DUT meets one or more specified operating parameters. A test system can optionally include multiple different classes of driver circuits to provide circuit test signals having different amplitude or timing characteristics. In an example, the test system is configured to measure a response from a DUT using an active load and a comparator circuit to sense transitions at a DUT pin.

A system for testing digital integrated circuits (ICs) can include a per-pin parametric measurement unit (PPMU or PMU). A PMU can be configured to operate in different modes to provide, or force, a current or voltage signal and to receive, or measure, a corresponding response from a DUT. The operating modes can include, for example, a force voltage measure current (FVMI) mode, a force current measure voltage (FIMV) mode, a force current measure current (FIMI) mode, a force voltage measure voltage (FVMV) mode, or a force nothing measure voltage (FNMV) mode. A PMU can have various force and sense operating ranges that can be modified using, for example, external amplifiers or resistors.

In an example, a test system can include a driver circuit configured to provide multiple voltage levels (e.g., Vhigh, Vlow and Vterm) to a DUT. The DUT can exhibit bidirectional (I/O) capability in that it can both source and receive stimulus. The driver circuit's Vhigh and Vlow levels serve to stimulate a DUT while in its "input" state, and Vterm acts as a termination for the DUT in its "output" state. The process of switching between Vhigh, Vlow, and Vterm can be conceptualized as a collection of three switches, with one terminal of each switch connected to either Vhigh, Vlow, or Vterm, and the other terminal connected to a 50 ohm resistor, which is then connected to the DUT node. Transitions between the three levels can be realized by opening and closing the appropriate switches, such as with only one switch closed at any given time. A test system can include other functions, such as an active load and high-speed comparator. The active load can provide the DUT with a bi-directional current source load, and the comparator can serve as a DUT waveform digitizer.

BRIEF SUMMARY

The present inventors have recognized, among other things, that a problem to be solved includes providing a packaged automated test system configured to provide driver, comparator, active load, and per-pin parametric measurement functions. The inventors have recognized the problem includes accommodating the speed and accuracy requirements of, for example, the driver, comparator, and active load circuitry using integrated device structures that occupy minimal die area, while minimizing loading effects at an interface with a device under test (DUT), and while maximizing a functional test range of the system. The problem can include providing a system that is relatively small, inexpensive to produce, consumes less power than traditional systems, or provides higher fidelity performance relative to traditional systems.

In an example, a solution to these and other problems can include or use a partitioned force-sense system. The solution can include, for example, a first portion of the force-sense system that is implemented using a first integrated circuit, a second portion of the same force-sense system that is implemented using a different second integrated circuit, and a first interface coupling the first and second portions of the force-sense system. In an example, the first interface comprises an electrically conductive, dual-purpose signal path coupling the first and second portions of the force-sense system. The second portion of the force-sense system can be coupled to a DUT interface. In a first test mode of the force-sense system, such as corresponding to DC or relatively low bandwidth current force signals, the first interface can be configured to communicate a DUT force signal from the first portion to the second portion of the force-sense system. In a second test mode, such as corresponding to relatively large current force signals, the first interface can be configured to communicate DUT sense information, such as received from the DUT using the second portion of the force-sense system, to the first portion of force-sense system.

In an example, the solution can include using different semiconductor substrates or different manufacturing processes to implement or build the different first and second portions of the force-sense system. For example, the solution can include using different first and second semiconductor materials for the first and second portions of the force-sense system. The first semiconductor material can be used to build integrated devices having a particular minimum feature size, and the second semiconductor material can be used to build integrated devices having a minimum feature size that is less than (i.e., smaller than) the particular minimum feature size built using the first semiconductor material. Devices made using the first semiconductor material can generally comprise lower-bandwidth devices than devices made using the second semiconductor material. In an example, the first portion of the force-sense system can comprise a complementary metal-oxide semiconductor (CMOS) wafer, and the second portion of the force-sense system can comprise a different type of wafer, such as a bipolar device-based wafer. In an example, the solution can include PMU circuitry built using CMOS and bipolar processes, and higher-current driver and active load circuitry built using a different process, such as a bipolar process. In an example, portions of the PMU circuitry can be distributed across dies that are built using different processes with an interface provided between the dies.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
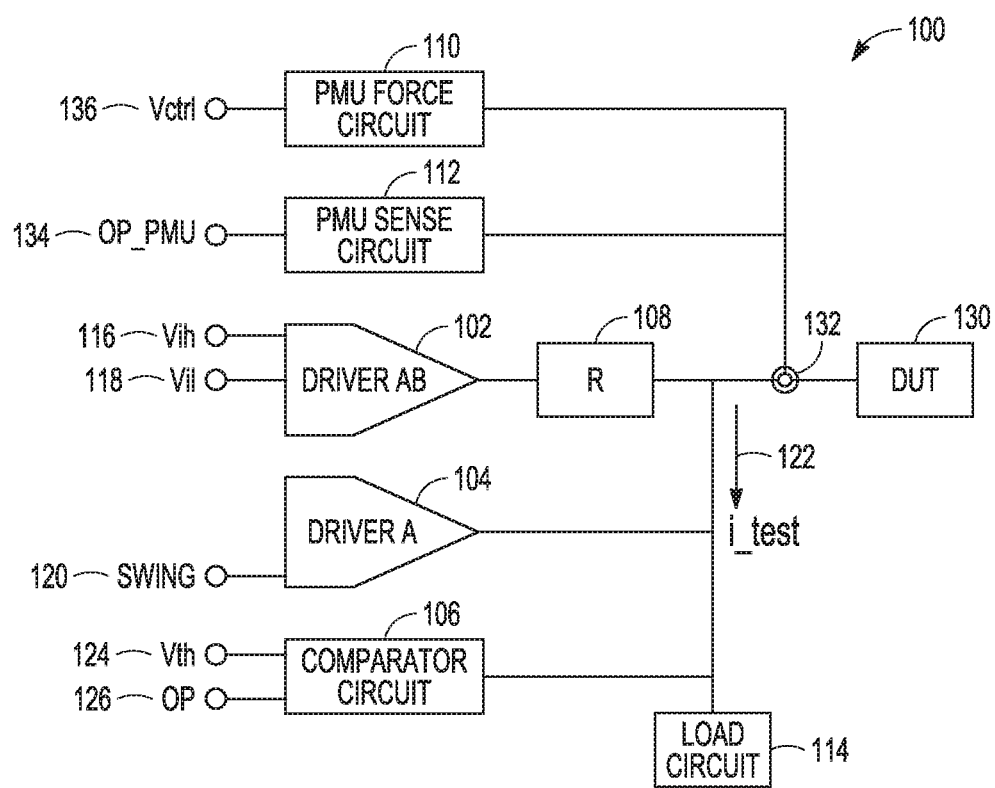
FIG. 1 illustrates generally an example of a force-sense test system topology including multiple driver circuits.

A test system, such as a force-sense test system for use with automated test equipment (ATE), can be configured to provide a voltage or current stimulus to a device under test (DUT) at a specified time, and optionally can measure a response from the DUT. The test system can be configured to provide high fidelity output signal pulses over a relatively large output signal magnitude range to accommodate different tests and different types of devices under test.

In an example, a force-sense system, or force-sense measurement device, can include a pin driver architecture that can provide high fidelity stimulus signals with minimal overshoot or spiking of high frequency current signals, and can enhance pulse edge placement accuracy and signal bandwidth at high or low power operating levels. The test system can include a single-package ATE solution that can include, among other things, a driver circuit, comparator circuit, and active load circuit, and a per-pin parametric measurement unit (PPMU or PMU), sometimes referred to herein as a PMU circuit. The driver, comparator, and active load circuits are referred to herein collectively as a DCL or DCL circuit. In an example, the PMU circuit can be configured for use in high precision, relatively lower frequency, lower bandwidth, and higher amplitude stimulus testing and the DCL circuit can be configured for use in relatively higher frequency and higher bandwidth stimulus testing. Control circuitry can be provided to select a particular force stimulus, such as from the PMU circuit or the DCL circuit, for use in a particular test depending on parameters or requirements of the test. In some examples, operation of the PMU circuit and the DCL circuit can be mutually exclusive such that only one of the circuits interfaces with the DUT at any given time. Various other control circuitry can be provided, such as including digital-to-analog converters (DACs) with on-chip calibration registers to enable use at different DC operating levels.

Various portions of the force-sense system can comprise, or can be built using different processes and/or different materials. For example, portions of the PMU circuit can be distributed across multiple different semiconductor devices of different semiconductor types, and an interface can be provided to facilitate signal communication between the different semiconductor devices. The interface can include a minimum number of signal paths or wires in order to reduce cost size and complexity.

In an example, the interface can include a particular signal path that is configured to communicate different information depending on an operating mode of the force-sense system. For example, in a first test mode the particular signal path can be configured to communicate a first DUT force signal from the first semiconductor device to the second semiconductor device. In a second test mode, the particular signal path can be configured to communicate DUT sense information, such as received from the DUT, from the second semiconductor device to the first semiconductor device. In an example, the first semiconductor device can comprise a CMOS-based device that is used to implement a front-end portion of the PMU circuit, and the second semiconductor device can comprise a bipolar-based device that is used to implement the DCL circuit and other portions of PMU circuit. The bipolar-based device can interface with the DUT using, among other things, bipolar junction transistor devices that help minimize loading at the DUT pin.

FIG. 1 illustrates generally a first example 100 of a force-sense test system topology including a PMU circuit and a DCL circuit. In the first example 100, the PMU circuit includes a PMU force circuit 110 and a PMU sense circuit 112 coupled to a DUT pin 132, and the DUT pin 132 can be coupled to a DUT 130. In the first example 100, the DCL circuit includes a first DriverAB 102 that can include a class AB driver circuit, and a first DriverA 104 that can include a class A driver circuit. The DCL circuit can include a comparator circuit 106 and a first load circuit 114, such as can include an active load or other loading device. The first example 100 can further include an output element such as a first resistor 108 that can be configured to provide a specified output or load impedance. In an example, the test system is configured to source or sink a first current signal 122, i_test, at the DUT pin 132 that is coupled to the DUT 130. The force-sense test system can be configured to concurrently perform voltage and current measurements on signals received from, or provided to, the DUT 130, such as while applying a voltage or current excitation stimulus to the DUT 130.

In an example, the PMU force circuit 110 can be configured to provide a stimulus using a digitally-configurable amplifier circuit and one or more output buffers. The PMU force circuit 110 can receive a digital control signal, such as a PMU control signal 136 Vctrl, and in response, the PMU force circuit 110 can provide a drive signal at the DUT pin 132. The PMU sense circuit 112 can be configured to receive voltage or current information from the DUT 130, such as using a resistive network. The PMU circuit can include a feedback network to receive test control signals, and the voltage or current information from the DUT 130, to thereby control operation of the PMU force circuit 110. In an example, the PMU sense circuit 112 can be configured to provide a PMU output signal 134 OP_PMU, such as to an external system controller.

In an example, the first DriverAB 102 can be configured to produce a voltage stimulus signal by selecting between parallel-connected diode bridges with each bridge driven by a unique, dedicated DC voltage level. In the first example 100 of FIG. 1, DC voltages Vih 116 and Vil 118 drive diode bridges in the first DriverAB 102. The switching stage can be followed by a voltage buffering stage that can provide power gain, such as can be used to produce large currents to serve a 50 ohm DUT environment.

In contrast with the first DriverAB 102, the first DriverA 104 can be configured to produce transitions at the DUT 130 using a relatively large current switch stage that can be coupled directly to the DUT 130. A current switching stage in the first DriverA 104 can alternately switch current into and out of the DUT 130 in response to a control signal Swing 120, such as can be a voltage control signal. The first DriverA 104 can provide high speed operation, for example, because it may be unburdened by the class AB voltage buffering stage with its attendant bandwidth limitations and other performance limitations.

In an example, the first DriverA 104 can be configured to provide a relatively low amplitude signal at the DUT 130. For example, the first DriverA 104 can provide a signal having about a 2 volt swing. The first DriverAB 102 can be configured to provide a relatively high amplitude signal at the DUT 130, for example, −1.5 to +7 volts. The first DriverA 104 generally operates at a higher switching speed or bandwidth than the first DriverAB 102. In an example, the first DriverAB 102 can be configured to absorb switching currents from the first DriverA 104. That is, the first DriverAB 102 can serve as a buffer that the first DriverA 104 can source current into, such as through the first resistor 108.

One or more of the PMU force circuit 110, the first DriverAB 102 and the first DriverA 104 can be selected to fulfill disparate DUT test requirements that may not otherwise be fulfilled by a single driver. For example, while each of the driver circuits can provide DUT signals or waveforms, the first DriverAB 102 can be configured to provide large amplitude, low bandwidth stimulus signals, and the first DriverA 104 can be configured to provide low amplitude, high bandwidth stimulus signals. The PMU force circuit 110, for example, can be configured to provide high amplitude current and voltage signals such as at DC or low bandwidth levels.

In an example, the PMU circuit and the DCL circuit include respective independent enable control pins. The independent enable controls can help facilitate independent operation of the different circuits. For example, the first DriverAB 102 can serve as a low speed, high voltage stimulus source, or can serve as a static, non-transitioning buffer to absorb switching currents from the first DriverA 104, such as depending on a state of a control signal at the enable control pin of the first DriverAB 102. In an example, the first DriverAB 102 and the first DriverA 104 can be disabled when the PMU circuit is active, and the PMU circuit can be disabled when one of the first DriverAB 102 and the first DriverA 104 is active.

FIG. 1 includes the comparator circuit 106. The comparator circuit 106 can include a multiple-stage comparator that is configured to receive signals from the DUT 130, such as via the DUT pin 132. The comparator circuit 106 can compare the received signals to a comparator reference signal 124 and, in response, provide a differential comparator output signal 126. For example, the comparator circuit 106 can receive a voltage response signal from the DUT 130 and compare an amplitude of the voltage response signal to an amplitude of the comparator reference signal 124. The comparator circuit 106 can provide information about the amplitude relationship using the differential comparator output signal 126, such as can include a digital signal or logic output signal.

Figure 2:
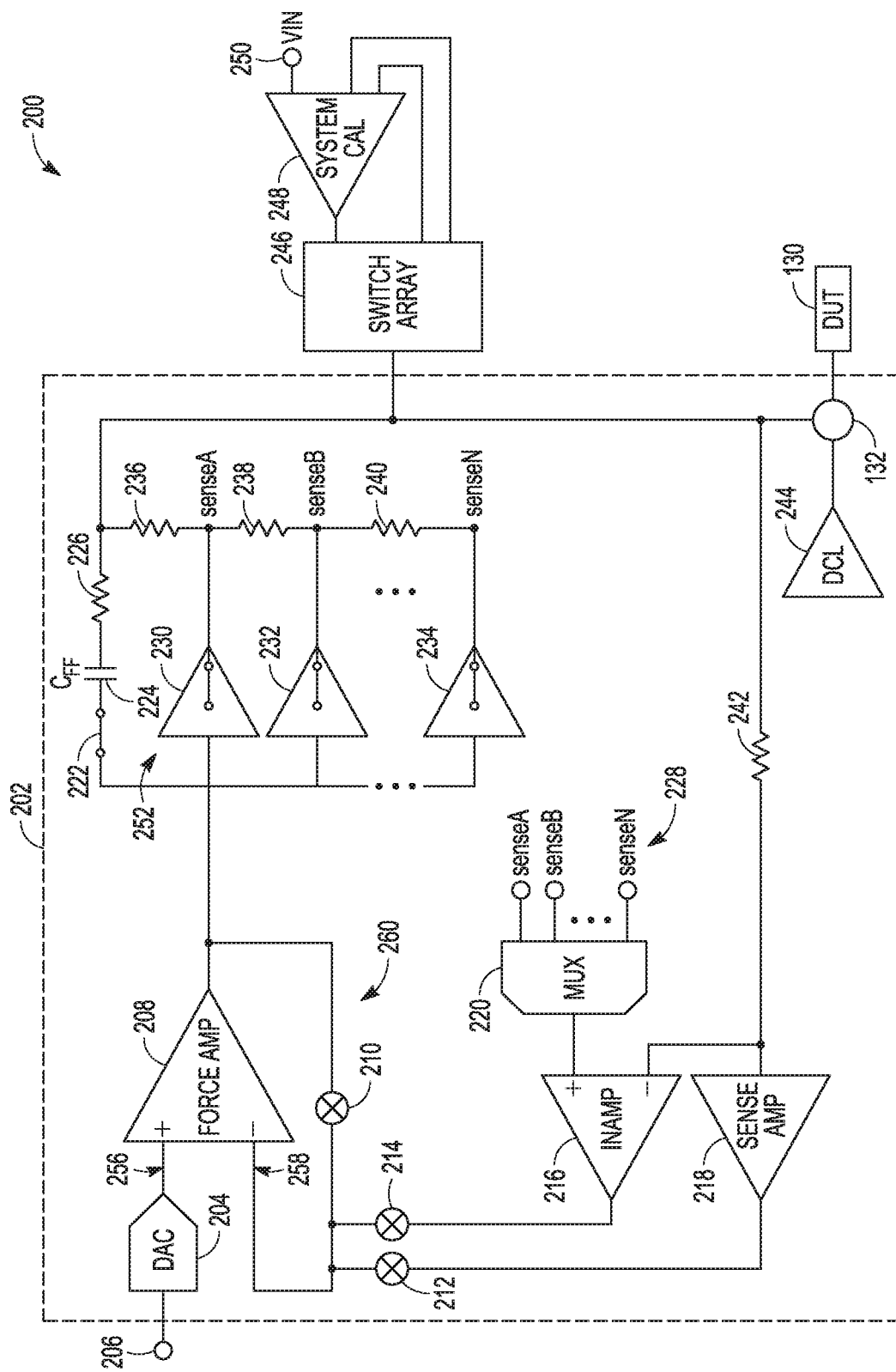
FIG. 2 illustrates generally a schematic example of a test system including a parametric measurement unit portion and driver, comparator, and active load (DCL) portion.

FIG. 2 illustrates generally a schematic example of a test system including a first portion with a parametric measurement unit, and a second portion with a driver, comparator, and active load. For example, FIG. 2 includes a first force-sense test system 200 that includes a force-sense device 202, the DUT 130, and a calibration network 254. The force-sense device 202 includes components that comprise a per-pin parametric measurement unit or a PMU circuit, and components that comprise a DCL circuit 244 including other driver, comparator, and active load circuitry.

The example of FIG. 2 can include or use various circuits, components, or functional blocks from the example of FIG. 1. For example, the force-sense device 202 can include the PMU circuit coupled to the same DUT pin 132 as the DCL circuit 244, such as similarly described above in the example of FIG. 1. The PMU circuit can be configured to support high precision, low bandwidth or DC force-sense interactions with the DUT 130, and the DCL circuit 244 can be configured to support relatively high speed force-sense interactions with the DUT 130.

In the example of FIG. 2, the DCL circuit 244 and the PMU circuit are coupled at the DUT pin 132, and the DUT pin 132 is coupled to the DUT 130. The DCL circuit 244 can include the first DriverAB 102, the first DriverA 104, the comparator circuit 106, the first load circuit 114, the first resistor 108, or other circuits or components configured to support relatively high speed force-sense interactions with the DUT 130.

Circuits and components in the force-sense device 202, such as other than those that comprise the DCL circuit 244, can comprise the PMU force circuit 110 and the PMU sense circuit 112 of the PMU in the force-sense device 202. For example, the PMU circuit can include a front-end portion with a digital-to-analog converter circuit, or first DAC 204, a first force amplifier 208, and a force control feedback network 260. The first force amplifier 208 can be configured to provide a drive signal to an output signal driver portion of the PMU circuit, and the driver portion can include an output buffer circuit network 252 coupled to the DUT pin 132. The PMU circuit can further include a DUT sense portion that is configured to receive or measure signals received from the DUT 130 via the DUT pin 132, such as by way of the DUT sense resistor 242.

In an example, the first DAC 204 can include a DAC control input 206 to receive a control signal from an external test controller. A signal at the DAC control input 206 can be specified by a user or program, such as to define one or more test parameters. In response to a signal at the DAC control input 206, the first DAC 204 can provide a test control signal 256 to the first force amplifier 208. The first force amplifier 208 can receive the test control signal 256 and a DUT information signal 258 and, in response, provide one of a DUT drive signal for communication to the DUT 130, or provide a buffer control signal to control one or more buffer circuits in the output buffer circuit network 252.

In an example, the output buffer circuit network 252 can be configured to provide multiple different signal paths between an output of the first force amplifier 208 and the DUT pin 132. For example, the first force amplifier 208 can provide a first DUT drive signal and the output buffer circuit network 252 can include a first signal path, for the first DUT drive signal, that includes a feed-forward switch 222, a feed-forward capacitor 224, and a feed-forward resistor 226. When the first signal path is used to provide a stimulus signal to the DUT pin 132, other buffers in the output buffer circuit network 252 can be disabled or off.

In an example, the first force amplifier 208 can provide a buffer control signal to the output buffer circuit network 252. The buffer control signal can be different than the first DUT drive signal. In response to the buffer control signal, at least one of a first buffer instance 230, a second buffer instance 232, and an nth buffer instance 234 can be enabled to provide a corresponding stimulus signal to the DUT pin 132. In an example, the different buffer instances can be configured to operate mutually exclusively such that only one of the buffer circuit instances operates at a particular time. In other examples, multiple buffer instances can be used together. Although the example of FIG. 2 illustrates the output buffer circuit network 252 as including three buffer instances, fewer or additional buffer circuit instances can similarly be used, and the buffer control signal can be configured to independently address the different buffer circuit instances.

The different buffer circuit instances in the output buffer circuit network 252 can be configured to provide output signals in different current signal ranges. That is, the different buffer instances can provide signals having different current magnitudes. For example, the first buffer instance 230 can be configured to provide a first buffered output signal, such as having a first current magnitude, to the DUT pin 132 via a first force-sense resistor 236. The second buffer instance 232 can be configured to provide a second buffered output signal, such as having a second current magnitude, to the DUT pin 132 via a series combination of a second force-sense resistor 238 and the first force-sense resistor 236. The nth buffer instance 234 can be configured to provide a third buffered output signal, such as having a third current magnitude, to the DUT pin 132 via a series combination of an nth force-sense resistor 240, the second force-sense resistor 238, and the first force-sense resistor 236. In this example, the second current magnitude can be greater than the third current magnitude, and the first current magnitude can be greater than the second current magnitude. In an example, the force-sense resistors, such as the first force-sense resistor 236, the second force-sense resistor 238, and the nth force-sense resistor 240, can have similar or different resistance values.

In an example, the PMU circuit includes the PMU sense circuit 112, such as including a DUT sense portion that is configured to receive or measure signals received from the DUT 130 via the DUT pin 132. The DUT sense portion can be configured to sense current and voltage information at the DUT pin 132, such as via a DUT sense resistor 242. When a value of the DUT sense resistor 242 is known, information about a current signal from the DUT 130 can be determined based on the voltage across the DUT sense resistor 242. In an example, the current signal information can be measured using an instrumentation amplifier circuit 216. The instrumentation amplifier circuit 216 can include a differential amplifier circuit that is configured to compare the current signal information from the DUT 130, such as received via the DUT sense resistor 242, with current information at a particular sense node in the output buffer circuit network 252 of the PMU circuit.

For example, an input to the instrumentation amplifier circuit 216 can be coupled to a first multiplexer circuit 220. The first multiplexer circuit 220 can include multiple multiplexer input nodes 228 that are coupled to respective sense nodes in the output buffer circuit network 252. The sense nodes can be disposed between the various series-coupled force-sense resistors. For example, the multiplexer input nodes 228 can include an input coupled to a senseA node that is between an output of the first buffer instance 230 and the first force-sense resistor 236, an input coupled to a senseB node that is between an output of the second buffer instance 232 and the second force-sense resistor 238, and so on. The first multiplexer circuit 220 can be configured to select a particular one of the sense nodes for use in the force control feedback network 260, or control loop, for the PMU circuit.

The force control feedback network 260 for the PMU circuit can include switches that are configured to control the information from the DUT 130 that is provided to a differential input of the first force amplifier 208. For example, the force control feedback network 260 can include a first switch 212 configured to selectively couple an output of the sense amplifier circuit 218 to the first force amplifier 208, a second switch 214 configured to selectively couple an output of the instrumentation amplifier circuit 216 to the first force amplifier 208, and a feedback switch 210 configured to selectively couple an output of the first force amplifier 208 to an input of the first force amplifier 208.

In the example of FIG. 2, the force-sense device 202 can be calibrated using the calibration network 254, and the calibration network 254 can be provided externally to the force-sense device 202. The calibration network 254 can include a calibration input 250 to receive a user-specified calibration signal, Vin, from an external source. The calibration network 254 can include a calibration amplifier 248 configured to receive the calibration input 250 and feedback information from a switch array 246. The switch array 246 can be coupled to the force-sense device 202 and configured to drive known signals (e.g., based on Vin) into the DUT 130 and into one or more other portions of the force-sense device 202. Response information or other behavior of DUT or of the force-sense device 202 can be monitored or measured in response to the known drive signals to thereby enable user-calibration of the first force-sense test system 200.

Figure 3:
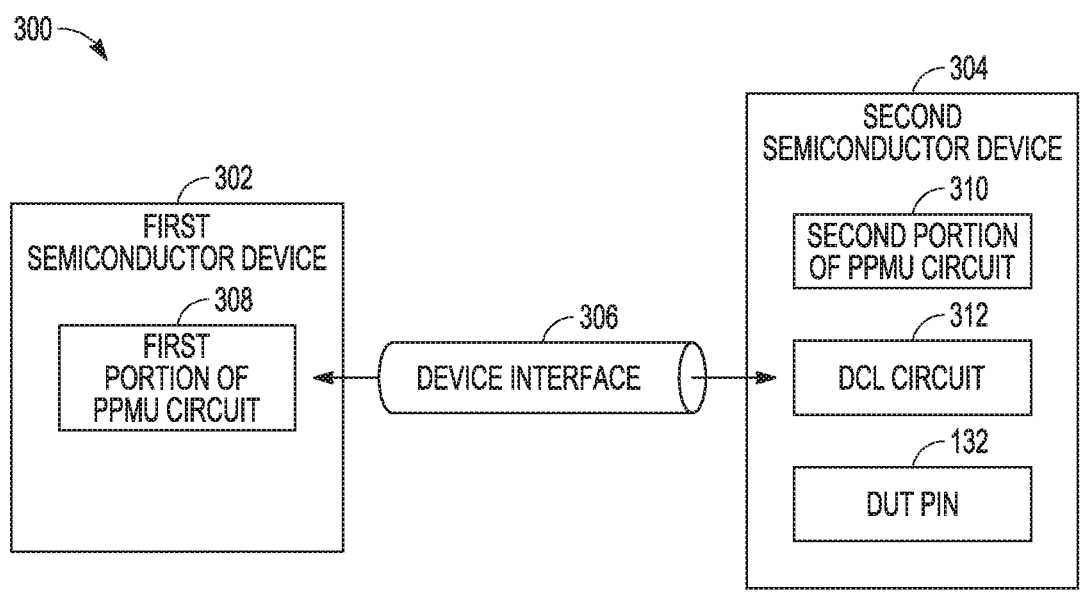
FIG. 3 illustrates generally an example of a first multiple-die force-sense test system.

FIG. 3 illustrates generally an example of a first multiple-die force-sense test system 300. The example of the first multiple-die force-sense test system 300 can comprise portions of the force-sense device 202 from the example of FIG. 2. The different portions of the force-sense device 202 can be built using different semiconductor devices of different semiconductor device types. For example, the first multiple-die force-sense test system 300 can include a first semiconductor device 302 and a second semiconductor device 304.

The first semiconductor device 302 can include a first portion 308 of the PMU circuit of the force-sense device 202, and the second semiconductor device 304 can include a second portion 310 of the same PMU circuit of the force-sense device 202. The second semiconductor device 304 can further include other circuits, such as a DCL circuit 312, such as can include or comprise the DCL circuit 244 from the example of FIG. 2. In the example of FIG. 3, the second semiconductor device 304 can further include the DUT pin 132 for interfacing with the DUT 130.

In an example, the first multiple-die force-sense test system 300 includes a device interface 306 to couple the first semiconductor device 302 and the second semiconductor device 304. The device interface 306 can include one or more signal paths configured to communicate information between the different semiconductor devices. The one or more electrical conductors can be configured for unidirectional or bidirectional communication.

In an example, a number of signal paths, or conductors, in the device interface 306 can be minimized to simplify interconnection between the different semiconductor devices. However, the number of signal paths in the device interface 306 can be sufficient to enable the first multiple-die force-sense test system 300 to be an integrated test solution such that an end user interfaces one DUT pin per channel of the first multiple-die force-sense test system 300.

In an example, the first semiconductor device 302, such as comprising the first portion 308 of the PMU circuit, can be a lower-cost, lower-speed semiconductor device on or with which integrated devices can be built. For example, the first semiconductor device 302 can comprise a CMOS-type die with which CMOS-type switch devices can be built. The second semiconductor device 304, such as comprising the second portion 310 of the PMU circuit, the DCL circuit 312, or other circuits, can be a higher-cost, higher-speed semiconductor device on or with which integrated devices can be built. For example, the second semiconductor device 304 can comprise a bipolar-type die with which bipolar-type switch devices can be built. The first semiconductor device 302 and its attendant manufacturing processes can include or use fewer masks, larger lithography, greater tolerances, and can have greater overall yield when compared to the second semiconductor device 304.

In the example of FIG. 3, the first portion 308 of the PMU circuit can thus be provided using a relatively lower-cost CMOS-type device. The second portion 310 of the PMU circuit, such as can include higher current range buffers, can be implemented using the second semiconductor device 304, such as comprising a bipolar-type device. Devices built using the second semiconductor device 304 can provide greater current ranges or swings, and less DUT pin loading, such as using base-collector diodes that can be reverse biased. The second semiconductor device 304 can further include force resistors, such as can be provided physically near the DUT pin 132, to help shield the DUT 130 from capacitive parasitics associated with components of the PMU circuit.

Figure 4:
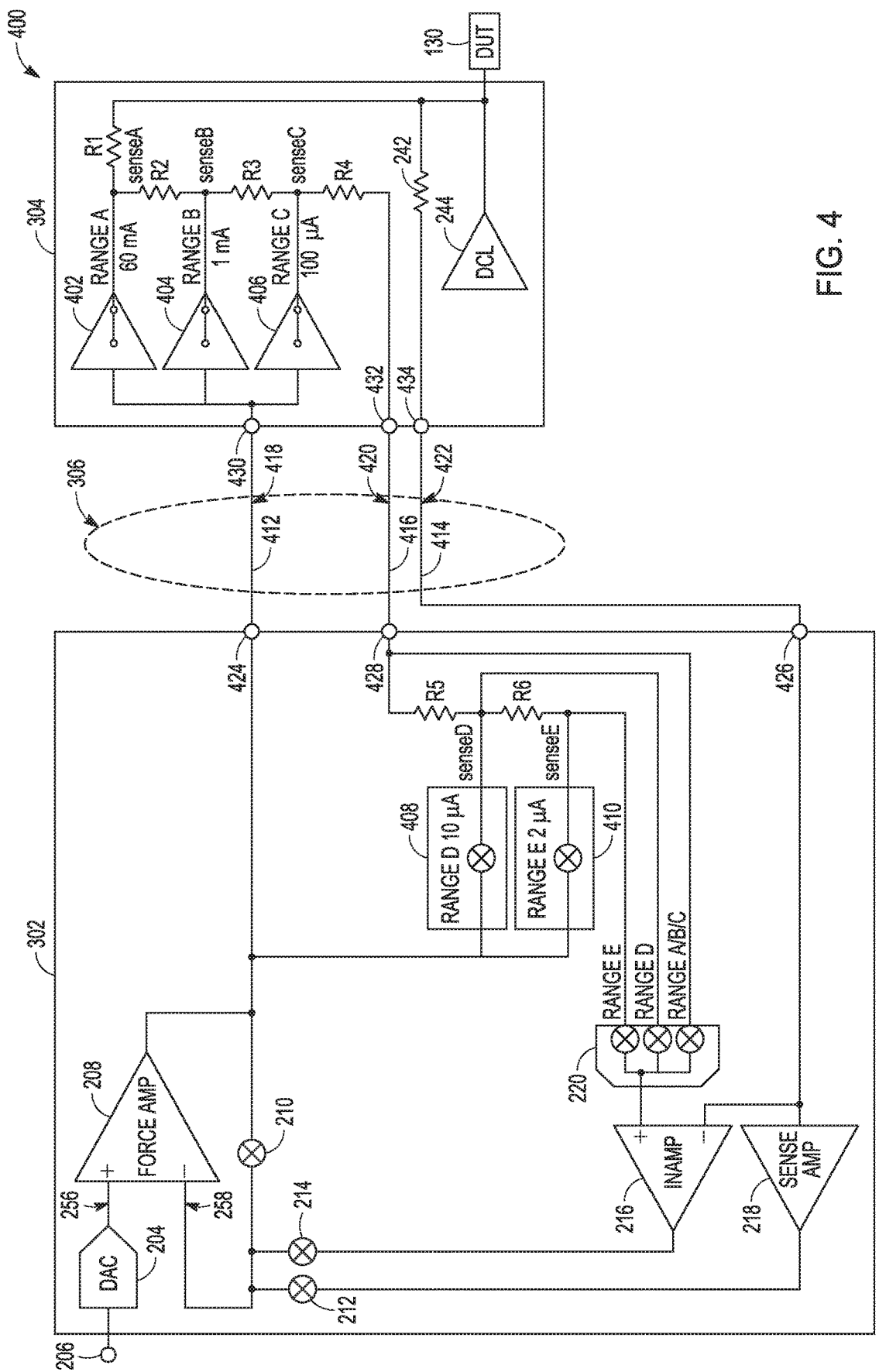
FIG. 4 illustrates generally an example of a second multiple-die force-sense test system.

FIG. 4 illustrates generally an example of a second multiple-die force-sense test system 400. The example of FIG. 4 illustrates how various aspects of the force-sense device 202 can be distributed across, or built on, multiple different semiconductor devices, and connected using an interface. For example, the second multiple-die force-sense test system 400 can include the first semiconductor device 302 coupled to the second semiconductor device 304 using the device interface 306. The second semiconductor device 304 can be coupled to the DUT 130.

In the example of FIG. 4, the first semiconductor device 302 includes various device interface nodes for exchanging signals with the second semiconductor device 304, and the second semiconductor device 304 includes various device interface nodes for exchanging signals with the first semiconductor device 302, such as using the device interface 306. For example, the first semiconductor device 302 includes a first device output node 424, a first device feedback node 426, and a first device dual-purpose node 428. The second semiconductor device 304 includes a second device input node 430, a second device feedback node 434, and a second device dual-purpose node 432. Various signal paths extending between the device interface nodes can comprise the device interface 306. For example, the device interface 306 can include a first signal path 412, a second signal path 414, and a bidirectional signal path 416. Generally, the first signal path 412 is a unidirectional signal path for communicating signals from the first semiconductor device 302 to the second semiconductor device 304, and the second signal path 414 is a unidirectional signal path for communicating signals from the second semiconductor device 304 to the first semiconductor device 302.

In an example, the first signal path 412 can transmit a force control signal 418 from the first semiconductor device 302 to the second semiconductor device 304. In an example, the first portion 308 of the PMU circuit includes various PMU front-end circuitry such as the first DAC 204 and the first force amplifier 208, as similarly described above in the discussion of FIG. 2. In the example of FIG. 4, the first force amplifier 208 can be configured to provide the force control signal 418 at the first device output node 424. The force control signal 418 can be transmitted using the first signal path 412 in the device interface 306 to the second device input node 430 at the second semiconductor device 304. In an example, the second device input node 430 is coupled to a buffer circuit network in the second semiconductor device 304, and the buffer circuit network includes various buffer circuit instances that can be independently or selectively configured to provide an output signal to the DUT 130 in response to the force control signal 418. That is, depending on control information in the force control signal 418, any one or more of the buffer circuits in the buffer circuit network can be selected or enabled, or deselected or disabled.

In the example of FIG. 4, the buffer circuit network includes a first buffer circuit 402, a second buffer circuit 404, and a third buffer circuit 406. Each of the buffer circuits can be configured to provide a current signal in a different current magnitude range. For example, the third buffer circuit 406 can be configured to provide a current signal having a magnitude of at least about x uA, the second buffer circuit 404 can be configured to provide a current signal having a magnitude of at least about 10x mA, and the first buffer circuit 402 can be configured to provide a current signal having a magnitude of at least about 100x mA.

Respective outputs of the different buffer circuits can be coupled to respective sense nodes that, in turn, can be coupled to respective portions of a resistive output network. In the example of FIG. 4, an output of the first buffer circuit 402 can be coupled through a first output resistor R1 to the DUT 130. An output of the second buffer circuit 404 can be coupled through a series combination of a second output resistor R2 and the first output resistor R1 to the DUT 130, and an output of the third buffer circuit 406 can be coupled through a series combination of a third output resistor R3, the second output resistor R2, and the first output resistor R1 to the DUT 130. Current magnitude information about a signal provided to the DUT 130 can be calculated based on known resistance characteristics of the resistive output network and voltage information measured from one or more of the sense nodes in the resistive output network. The same sense nodes of the resistive network can be used to read magnitude information about current signals that are received from the DUT 130.

The second signal path 414 can transmit a first DUT sense signal 422 from the second semiconductor device 304 to the first semiconductor device 302. The first DUT sense signal 422 can include a current or voltage signal received from the DUT 130, for example via the DUT sense resistor 242. The second semiconductor device 304 can provide the first DUT sense signal 422 at the second device feedback node 434, and the first semiconductor device 302 can receive the first DUT sense signal 422 at the first device feedback node 426. As similarly explained in the discussion of FIG. 2, the first DUT sense signal 422 can include information that can be provided to the instrumentation amplifier circuit 216 or the sense amplifier circuit 218, for example, for use in generating a feedback signal that can be provided to the front-end portion of the PMU circuit.

The bidirectional signal path 416 can be configured to transmit a force-sense signal 420 between the first device dual-purpose node 428 at the first semiconductor device 302 and the second device dual-purpose node 432 at the second semiconductor device 304. Characteristics of the force-sense signal 420 can depend on an operating mode of the second multiple-die force-sense test system 400. For example, in a first test mode or operating mode of the second multiple-die force-sense test system 400, the force-sense signal 420 can include an unbuffered, small-magnitude DUT force signal that is communicated from the first semiconductor device 302 to the DUT 130 by way of the second semiconductor device 304. In a second test mode or operating mode of the second multiple-die force-sense test system 400, the force-sense signal 420 can include a second DUT sense signal that is received by the second semiconductor device 304 and communicated from the second semiconductor device 304 to the first semiconductor device 302.

In an example, the small-magnitude DUT force signal can be generated using a signal source on the first semiconductor device 302. In FIG. 4, the small-magnitude DUT force signal can be provided using at least one of a first switch 408 and a second switch 410. At least one of the first switch 408 and the second switch 410 can be configured to pass an output signal from the first force amplifier 208 to the first device dual-purpose node 428, and the first switch 408 and the second switch 410 can be independently-controlled.

Respective outputs of the first switch 408 and the second switch 410 can be coupled to respective sense nodes on the first semiconductor device 302, and the sense nodes can be coupled to respective portions of a resistive output network on the second semiconductor device 304. In the example of FIG. 4, an output of the first switch 408 can be coupled at a node senseD through a fifth output resistor R5 to the first device dual-purpose node 428, and an output of the second switch 410 can be coupled at a node senseE through a series combination of a sixth output resistor R6 and the fifth output resistor R5 to the first device dual-purpose node 428. In the first operating mode of the second multiple-die force-sense test system 400, the output of the first switch 408 or the second switch 410 comprises the small-magnitude DUT force signal that is communicated using the bidirectional signal path 416 to the second device dual-purpose node 432 at the second semiconductor device 304. The second device dual-purpose node 432 can be coupled to the DUT 130 by way of a series combination of a fourth resistor R4, the third resistor R3, the second resistor R2, and the first resistor R1.

In an example, the signal provided via the first switch 408 and the second switch 410 can have different magnitude characteristics. For example, a current signal received at the second semiconductor device 304 via the second switch 410 can have a magnitude of at least about x uA, and a different current signal received at the second semiconductor device 304 via the first switch 408 can have a magnitude of at least about 10x uA.

In the second operating mode of the second multiple-die force-sense test system 400, the bidirectional signal path 416 can be configured to transmit the second DUT sense signal from the second semiconductor device 304 to the first semiconductor device 302. That is, the second semiconductor device 304 can receive DUT information from the DUT 130 and provide, at the second device dual-purpose node 432, the second DUT sense signal to the first device dual-purpose node 428 of the first semiconductor device 302. The second DUT sense signal can, in an example, be reported to a control system or can be received by the first multiplexer circuit 220 and used by the force control feedback network 260. In an example, the second device dual-purpose node 432 can provide the second DUT sense signal and the second device feedback node 434 can concurrently provide the first DUT sense signal 422.

The example of the second multiple-die force-sense test system 400 includes various switches, sources, signal paths, and other devices that can be independently or jointly configured to provide a small-magnitude DUT current force signal. However, fewer or additional switches, sources, signal paths, and/or other devices can similarly be used. The example of the second multiple-die force-sense test system 400 includes three buffer circuits, including the first buffer circuit 402, the second buffer circuit 404, and the third buffer circuit 406. However, fewer or additional buffer circuits can similarly be used.

The example of FIG. 4, among others discussed herein, illustrate generally a particular instance of a force-sense channel or pin driver for a test system. In practice, multiple instances of force-sense channels can be used to provide a robust, multiple-channel ATE system. A number of instances used for a particular test can depend on, or correspond to, a number of different DUTs or DUT nodes to be tested, for example, concurrently.

Figure 5:
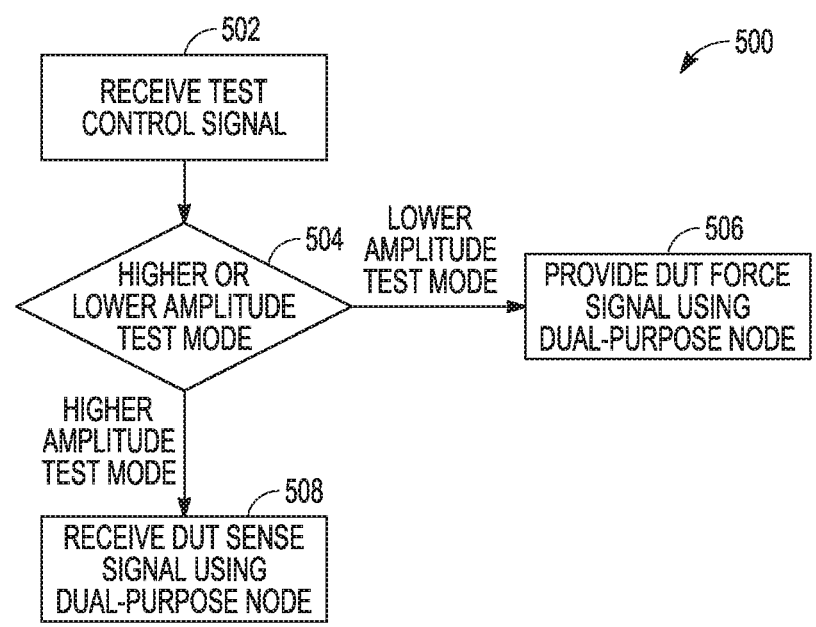
FIG. 5 illustrates generally an example of a method that can include using a dual-purpose interface between semiconductor devices.

FIG. 5 illustrates generally an example of a first method 500 that can include using a dual-purpose interface between semiconductor devices. For example, the first method 500 can include or use the first multiple-die force-sense test system 300 from the example of FIG. 3, or can include or use the second multiple-die force-sense test system 400 from the example of FIG. 4. In an example, the dual-purpose interface can include a signal path, such as a single-wire electrical communication path, that extends between and couples multiple semiconductor devices of different semiconductor types. For example, the dual-purpose interface can include an electrically conductive wire that couples the first semiconductor device 302 and the second semiconductor device 304.

At block 502, the first method 500 can include receiving a test control signal. Block 502 can include using the first DAC 204 to receive the test control signal Vctrl at the DAC control input 206. In an example, the test control signal can indicate various parameters of a test to perform for a particular DUT, or for a particular pin of a particular DUT. The parameters can include, among other things, a magnitude or frequency of a test signal to generate and provide the DUT.

At decision block 504, the first method 500 can include determining a mode in which to operate a test system. For example, the test system can be operable in at least a lower amplitude test mode and a greater amplitude test mode. In the lower amplitude test mode, the test system can be configured to use circuitry to provide relatively lower amplitude current stimulus signals to the DUT. In the greater amplitude test mode, the test system can be configured to use other circuitry to provide relatively higher amplitude current stimulus signals to the DUT.

If the lower amplitude test mode is selected at decision block 504, then the first method 500 can proceed to block 506. At block 506, the first method 500 can include providing a DUT force signal using a dual-purpose node on a first semiconductor device. The DUT force signal can be received by a different second semiconductor device and then provided to the DUT. For example, block 506 can include providing the DUT force signal from the first device dual-purpose node 428 of the first semiconductor device 302 to the second device dual-purpose node 432 of the second semiconductor device 304 using the bidirectional signal path 416 of the device interface 306.

If the higher amplitude test mode is selected at decision block 504, then the first method 500 can proceed to block 508. At block 508, the first method 500 can include providing a DUT sense signal using a dual-purpose node on the second semiconductor device. The DUT sense signal can be received by the different first semiconductor device and then reported to a control system, or can be otherwise used in a feedback control loop of the test system. For example, block 508 can include providing the DUT sense signal from the second device dual-purpose node 432 of the second semiconductor device 304 to the first device dual-purpose node 428 of the first semiconductor device 302 using the bidirectional signal path 416 of the device interface 306.

Various aspects of the present disclosure can help provide a solution to the test system-related problems identified herein. In an example, Aspect 1 can include or use subject matter (such as an apparatus, a system, a device, a method, a means for performing acts, or a device readable medium including instructions that, when performed by the device, can cause the device to perform acts, or an article of manufacture), such as can include or use a force-sense system for providing signals to, or receiving signals from, a device under test (DUT) at a first DUT node. In Aspect 1, the system can include an interface coupling first and second portions of a first force-sense measurement device, wherein the first and second portions of the first force-sense measurement device are provided using respective different integrated circuits, such as can be provided using different semiconductors of different types. In an example, the force-sense system of Aspect 1 can operate in one of multiple different modes. In a first test mode, the interface can be configured to communicate a first DUT force signal from the first portion to the second portion of the first force-sense measurement device, and in a second test mode, the interface can be configured to communicate DUT sense information, received from the DUT at the first DUT node, from the second portion to the first portion of the first force-sense measurement device.

Aspect 2 can include or use, or can optionally be combined with the subject matter of Aspect 1, to optionally include the interface as a single, electrically-conductive signal path.

Aspect 3 can include or use, or can optionally be combined with the subject matter of Aspect 1, to optionally include the interface as multiple different signal paths including a first signal path configured to communicate a force control signal from the first portion to the second portion of the first force-sense measurement device, a second signal path configured to communicate a first voltage sense signal from the second portion to the first portion of the first force-sense measurement device, and a bidirectional signal path configured to communicate the first DUT force signal in the first test mode and configured to communicate the DUT sense information in the second test mode.

Aspect 4 can include or use, or can optionally be combined with the subject matter of one or any combination of Aspects 1 through 3 to optionally include the second portion of the first force-sense measurement device comprising multiple buffer circuits, and in the second test mode, one or more of the buffer circuits can be configured to receive a force control signal from the first portion of the first force-sense measurement device and, in response, provide a second DUT force signal to the DUT.

Aspect 5 can include or use, or can optionally be combined with the subject matter of one or any combination of Aspects 1 through 4 to optionally include the second portion of the first force-sense measurement device comprising multiple sense resistors coupled in series between the DUT node and the interface.

Aspect 6 can include or use, or can optionally be combined with the subject matter of Aspect 5, to optionally include the first portion of the first force-sense measurement device comprising an adjustable current drive configured to provide the first DUT force signal to the sense resistors via the interface.

Aspect 7 can include or use, or can optionally be combined with the subject matter of one or any combination of Aspects 1 through 6 to optionally include or use multiple instances of the interface, wherein each instance of the interface corresponds to a respective different DUT node.

Aspect 8 can include or use, or can optionally be combined with the subject matter of Aspect 7, to optionally include or use first and second instances of the interface that are concurrently operable in different test modes.

Aspect 9 can include or use, or can optionally be combined with the subject matter of one or any combination of Aspects 1 through 8 to optionally include the first portion of the first force-sense measurement device comprising a portion of a first semiconductor die of a first semiconductor material type, and the second portion of the first force-sense measurement device comprising a portion of a second semiconductor die of a second semiconductor material type that is different than the first semiconductor material type.

Aspect 10 can include or use, or can optionally be combined with the subject matter of Aspect 9, to optionally include the second semiconductor die comprising the DUT node.

Aspect 11 can include or use, or can optionally be combined with the subject matter of Aspect 10, to optionally include or use a second force-sense measurement device comprising a signal driver, a comparator, and an active load coupled to the DUT node. The second force-sense measurement device can be independent of the first force-sense measurement device, and the second force-sense measurement device can comprise a portion of the second semiconductor die of the second semiconductor material type.

Aspect 12 can include or use, or can optionally be combined with the subject matter of one or any combination of Aspects 9 through 11 to optionally include the first semiconductor die of the first semiconductor material type comprising relatively lower-bandwidth integrated devices, and the second semiconductor die of the second semiconductor material type comprising relatively higher-bandwidth integrated devices than the lower-bandwidth integrated devices on the first semiconductor die.

Aspect 13 can include or use, or can optionally be combined with the subject matter of one or any combination of Aspects 1 through 12 to optionally include the first portion of the first force-sense measurement device configured to receive a force control signal, such as from a DAC circuit, and the second portion of the first force-sense measurement device can be configured to provide a second DUT force signal that is based, at least in part, on the force control signal.

Aspect 14 can include or use, or can optionally be combined with the subject matter of Aspect 13, to optionally include the first and second DUT force signals comprising current signals having respective lesser first and greater second magnitude characteristics.

Aspect 15 can include or use, or can optionally be combined with the subject matter of Aspect 14, to optionally include the first DUT force signal comprising a current signal in a first current magnitude range with a first upper current magnitude limit, and the second DUT force signal comprising a current signal in a second current magnitude range with a second upper current magnitude limit that exceeds the first upper current magnitude limit.

Aspect 16 can include or use, or can optionally be combined with the subject matter of one or any combination of Aspects 1 through 15 to optionally include the first portion of the force-sense measurement device comprising a feedback network with an amplifier that is configured to receive a test control signal and the DUT sense information and, in response, provide a buffer control signal to a buffer circuit in the second portion of the first force-sense measurement device, and in the second test mode, the buffer circuit can be configured to provide a second DUT force signal to the DUT node.

In an example, Aspect 17 can include or use subject matter (such as an apparatus, a system, a device, a method, a means for performing acts, or a device readable medium including instructions that, when performed by the device, can cause the device to perform acts, or an article of manufacture), such as can include or use a test system for interfacing with a device under test (DUT). In Aspect 17, the test system can include a feedback network with an amplifier configured to receive a test control signal and information from the DUT and, in response, provide a first force control signal at an output node. The test system can further include a feedback node configured to receive first DUT sense information from the DUT, and a dual-purpose node. In a first test mode (e.g., a lower current stimulus test mode), the dual-purpose node can be configured to provide an unbuffered first DUT force signal having a first magnitude characteristic, and in a second test mode (e.g., a higher current stimulus test mode), the dual-purpose node can be configured to receive second DUT sense information from the DUT. Aspect 17 can further include communication circuitry configured to exchange information between the output node, the feedback node, the dual-purpose node, and the DUT. The communication circuitry can include, for example, a portion of a PMU circuit. In an example, the communication circuitry can comprise a portion of a different semiconductor device than a semiconductor device that comprises the feedback network, the output node, the feedback node, or the dual-purpose node.

In the example of Aspect 17, such as in the first test mode, the dual-purpose node can be configured to provide an unbuffered DUT force signal (e.g., corresponding to the first DUT force signal) to the DUT via the communication circuitry, and the unbuffered DUT force signal can have the first magnitude characteristic. In the second test mode, the communication circuitry can be configured to provide a buffered DUT force signal (e.g., corresponding to a second DUT force signal) to the DUT in response to the first force control signal from the feedback network, and the dual-purpose node can be configured to receive, from the communication circuitry, the second DUT sense information from the DUT.

Aspect 18 can include or use, or can optionally be combined with the subject matter of Aspect 17, to optionally include the feedback node and the dual-purpose node configured to concurrently receive the first and second DUT sense information from the DUT via the communication circuitry.

Aspect 19 can include or use, or can optionally be combined with the subject matter of one or any combination of Aspects 17 or 18 to optionally include the communication circuitry comprising buffer circuitry that is configured to receive the first force control signal from the output node. In Aspect 19, the buffer circuitry can be configured to provide a second DUT force signal having a second magnitude characteristic, and the second magnitude characteristic is greater than the first magnitude characteristic of the first DUT force signal.

Aspect 20 can include or use, or can optionally be combined with the subject matter of Aspect 19, to optionally include the communication circuitry comprising a resistive network coupled to an output of the buffer circuitry, to a DUT node, and to the dual-purpose node.

Aspect 21 can include or use, or can optionally be combined with the subject matter of Aspect 20, to optionally include the feedback network comprising a portion of a first semiconductor of a first semiconductor material type, and the resistive network and the buffer circuitry comprising a portion of a second semiconductor of a second semiconductor material type. In Aspect 21, the dual-purpose node can be coupled to a single-wire interface between the first and second semiconductors, such as to couple the dual-purpose node to the communication circuitry.

In an example, Aspect 22 can include or use subject matter (such as an apparatus, a system, a device, a method, a means for performing acts, or a device readable medium including instructions that, when performed by the device, can cause the device to perform acts, or an article of manufacture), such as can include or use a system for providing signals to, or receiving signals from, a device under test (DUT). Aspect 22 can include a parametric measurement unit (PMU) comprising circuitry disposed on first and different second semiconductor substrates of different semiconductor types, and the PMU circuitry on the second semiconductor substrate can be configured to provide a DUT signal to the DUT. Aspect 22 can include an interface between the PMU circuitry on the first and second semiconductor substrates, and the interface can include various signal paths including a first signal path configured to communicate a first force control signal, a second signal path configured to communicate first DUT sense information about a signal from the DUT, and a third signal path configured to communicate a first force signal and second DUT sense information about the signal from the DUT. In Aspect 22, the first DUT force signal comprises the DUT signal.

Aspect 23 can include or use, or can optionally be combined with the subject matter of Aspect 22, to optionally include the first semiconductor substrate comprising a first semiconductor die of a first semiconductor material type that comprises lower-bandwidth integrated devices, and the second semiconductor substrate comprising a different second semiconductor die of a second semiconductor material type that comprises higher-bandwidth integrated devices than the lower-bandwidth integrated devices.

Aspect 24 can include or use, or can optionally be combined with the subject matter of one or any combination of Aspect 22 and Aspect 23, to optionally include or use a driver-comparator-load (DCL) unit comprising circuitry disposed on the second semiconductor substrate and configured to provide a DCL DUT signal to the DUT at a DUT node. In Aspect 24, the PMU is configured to provide the DUT signal at the same DUT node.

Aspect 25 can include or use, or can optionally be combined with the subject matter of one or any combination of Aspects 22 through 24 to optionally include the third signal path configured to communicate the first DUT force signal in a first system test mode and the DUT signal comprises a current signal having a first upper current magnitude limit, and the third signal path configured to communicate the second DUT sense information in a second system test mode and the DUT signal comprises a current signal having a second upper current magnitude limit that is less than the first upper current magnitude limit. In Aspect 25, the first and second system test modes can be mutually exclusive operating modes.

Each of these non-limiting Aspects can stand on its own, or can be combined in various permutations or combinations with one or more of the other Aspects, examples, or features discussed elsewhere herein.

This detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. The present inventors contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein."

In the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods or circuit operations or circuit configuration instructions as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A force-sense system for providing signals to, or receiving signals from, a device under test (DUT) at a first DUT node, the system comprising:
   an interface coupling first and second portions of a first force-sense measurement device, wherein the first and second portions of the first force-sense measurement device are provided using respective different integrated circuits, wherein:
      in a first test mode, the interface is configured to communicate a first DUT force signal from the first portion to the second portion of the first force-sense measurement device, and
      in a second test mode, the interface is configured to communicate DUT sense information, received from the DUT at the first DUT node, from the second portion to the first portion of the first force-sense measurement device.

2. The force-sense system of claim 1, wherein the interface comprises:
   a first signal path configured to communicate a force control signal from the first portion to the second portion of the first force-sense measurement device;
   a second signal path configured to communicate a first voltage sense signal from the second portion to the first portion of the first force-sense measurement device; and
   a bidirectional signal path configured to communicate the first DUT force signal in the first test mode and configured to communicate the DUT sense information in the second test mode.

3. The force-sense system of claim 1, wherein the second portion of the first force-sense measurement device comprises multiple buffer circuits, and
   wherein in the second test mode, one or more of the buffer circuits is configured to receive a force control signal from the first portion of the first force-sense measurement device and, in response, provide a second DUT force signal to the DUT.

4. The force-sense system of claim 1, wherein the second portion of the first force-sense measurement device comprises multiple sense resistors coupled in series between the DUT node and the interface.

5. The force-sense system of claim 4, wherein the first portion of the first force-sense measurement device comprises an adjustable current drive configured to provide the first DUT force signal to the sense resistors via the interface.

6. The force-sense system of claim 1, wherein the first portion of the first force-sense measurement device comprises a portion of a first semiconductor die of a first semiconductor material type, and wherein the second portion of the first force-sense measurement device comprises a portion of a second semiconductor die of a second semiconductor material type that is different than the first semiconductor material type.

7. The force-sense system of claim 6, wherein the second semiconductor die comprises the DUT node.

8. The force-sense system of claim 7, further comprising:
   a second force-sense measurement device comprising a signal driver, a comparator, and an active load coupled to the DUT node, wherein the second force-sense measurement device is independent of the first force-sense measurement device, and the second force-sense measurement device comprises a portion of the second semiconductor die of the second semiconductor material type.

9. The force-sense system of claim 6, wherein the first semiconductor die of the first semiconductor material type comprises lower-bandwidth integrated devices, and the second semiconductor die of the second semiconductor material type comprises higher-bandwidth integrated devices.

10. The force-sense system of claim 1, wherein the first portion of the first force-sense measurement device is configured to receive a force control signal; and
wherein the second portion of the first force-sense measurement device is configured to provide a second DUT force signal, and the second DUT force signal is based on the force control signal.

11. The force-sense system of claim 10, wherein the first and second DUT force signals comprise current signals having respective lesser first and greater second magnitude characteristics.

12. The force-sense system of claim 1, wherein the first portion of the force-sense measurement device comprises a feedback network with an amplifier that is configured to receive a test control signal and the DUT sense information and, in response, provide a buffer control signal to a buffer circuit in the second portion of the first force-sense measurement device, and wherein in the second test mode, the buffer circuit is configured to provide a second DUT force signal to the DUT node.

13. A test system for interfacing with a device under test (DUT), the test system comprising:
a feedback network with an amplifier configured to receive a test control signal and information from the DUT and, in response, provide a first force control signal at an output node;
a feedback node configured to receive first DUT sense information from the DUT;
a dual-purpose node; and
communication circuitry configured to exchange information between the output node, the feedback node, the dual-purpose node, and the DUT;
wherein, in a first test mode: the dual-purpose node is configured to provide an unbuffered DUT force signal to the DUT via the communication circuitry, the unbuffered DUT force signal having a first magnitude characteristic, and
wherein, in a second test mode: the communication circuitry is configured to provide a buffered DUT force signal to the DUT in response to the first force control signal from the feedback network, and the dual-purpose node is configured to receive, from the communication circuitry, second DUT sense information from the DUT.

14. The test system of claim 13, wherein the feedback node and the dual-purpose node are configured to concurrently receive the first and second DUT sense information from the DUT via the communication circuitry.

15. The test system of claim 14, wherein the communication circuitry comprises:
buffer circuitry configured to receive the first force control signal from the output node; and
a resistive network coupled to an output of the buffer circuitry, a DUT node, and the dual-purpose node;
wherein the buffer circuitry is configured to provide the buffered DUT force signal having a second magnitude characteristic, and wherein the second magnitude characteristic is greater than the first magnitude characteristic of the unbuffered DUT force signal.

16. The test system for interfacing of claim 15, wherein:
the feedback network comprises a portion of a first semiconductor of a first semiconductor material type; and
the resistive network and the buffer circuitry comprise a portion of a second semiconductor of a second semiconductor material type; and
wherein the dual-purpose node is coupled to a single-wire interface between the first and second semiconductors.

17. A system for providing signals to, or receiving signals from, a device under test (DUT), the system comprising:
a parametric measurement unit (PMU) comprising circuitry disposed on first and different second semiconductor substrates of different semiconductor types, wherein the PMU circuitry on the second semiconductor substrate is configured to provide a DUT signal to the DUT; and
an interface between the PMU circuitry on the first and second semiconductor substrates, the interface comprising:
a first signal path configured to communicate a first force control signal;
a second signal path configured to communicate first DUT sense information about a signal from the DUT; and
a third signal path configured to communicate a first force signal and second DUT sense information about the signal from the DUT, wherein the first DUT force signal comprises the DUT signal.

18. The system of claim 17, wherein the first semiconductor substrate comprises a first semiconductor die of a first semiconductor material type that comprises lower-bandwidth integrated devices, and wherein the second semiconductor substrate comprises a different second semiconductor die of a second semiconductor material type that comprises higher-bandwidth integrated devices than the lower-bandwidth integrated devices.

19. The system of claim 17, further comprising:
a driver-comparator-load (DCL) unit comprising circuitry disposed on the second semiconductor substrate and configured to provide a DCL DUT signal to the DUT at a DUT node;
wherein the PMU is configured to provide the DUT signal at the DUT node.

20. The system of claim 17, wherein the third signal path is configured to communicate the first DUT force signal in a first system test mode and the DUT signal comprises a current signal having a first upper current magnitude limit;
wherein the third signal path is configured to communicate the second DUT sense information in a second system test mode and the DUT signal comprises a current signal having a second upper current magnitude limit that is greater than the first upper current magnitude limit; and
wherein the first and second system test modes are mutually exclusive operating modes.

* * * * *